United States Patent [19]

Fujihira

[11] Patent Number: 5,118,638
[45] Date of Patent: Jun. 2, 1992

[54] METHOD FOR MANUFACTURING MOS TYPE SEMICONDUCTOR DEVICES

[75] Inventor: Tatsuhiko Fujihira, Kawasaki, Japan

[73] Assignee: Fuji Electric Co., Ltd., Kawasaki, Japan

[21] Appl. No.: 737,480

[22] Filed: Jul. 30, 1991

Related U.S. Application Data

[63] Continuation-in-part of Ser. No. 321,163, Mar. 9, 1989, abandoned.

[51] Int. Cl.$^5$ .......................................... H01L 21/336
[52] U.S. Cl. ........................................ 437/41; 437/29;
437/44; 437/150; 437/158; 437/228; 437/986;
148/DIG. 126; 385/23.4
[58] Field of Search .................. 437/29, 40, 41, 44,
437/150, 153, 154, 158, 228, 986; 148/DIG.
126; 357/23.4

[56] References Cited

U.S. PATENT DOCUMENTS

| | | | |
|---|---|---|---|
| 4,430,792 | 2/1984 | Temple | 437/41 |
| 4,466,176 | 8/1984 | Temple | 437/41 |
| 4,503,398 | 3/1985 | Vora et al. | 357/23.4 X |
| 4,587,713 | 5/1986 | Goodman et al. | 357/23.4 X |
| 4,672,047 | 6/1987 | Nakagawa et al. | 357/23.4 |
| 4,680,604 | 7/1987 | Nakagawa et al. | 357/23.4 |
| 4,774,198 | 9/1988 | Contiero et al. | 437/30 |
| 4,810,665 | 3/1989 | Chang et al. | 437/30 |
| 4,855,799 | 8/1989 | Tanabe et al. | 357/23.4 |
| 4,914,047 | 4/1990 | Seki | 437/29 |
| 4,931,408 | 6/1990 | Hshieh | 437/44 |
| 5,049,512 | 9/1991 | Throngnumchai | 437/29 |

FOREIGN PATENT DOCUMENTS

| | | |
|---|---|---|
| 0244366 | 11/1987 | European Pat. Off. . |
| 3634982 | 10/1987 | Fed. Rep. of Germany . |
| 60-186068 | 9/1985 | Japan . |
| 61-156882 | 7/1986 | Japan . |
| 62-176186 | 8/1987 | Japan . |
| 62-266871 | 11/1987 | Japan . |

*Primary Examiner*—T. N. Quach
*Attorney, Agent, or Firm*—Spencer, Frank & Schneider

[57] ABSTRACT

A method for manufacturing a MOS type semiconductor device includes the sequential introduction of base and source layer region impurities in a base layer of a second conductivity type, disposed in a semiconductor drain layer of a first conductivity type. The sequential introduction steps include forming an insulating layer on the surface of the semiconductor drain layer and on a gate electrode, introducing ions of the second conductivity type impurity into the base layer to form a low resistivity base layer region in the base layer while using the insulating layer as a mask, isotropically etching the insulating layer to reduce the initial thickness of the insulating layer and the width of the sidewall which overlaps the resultant low resistivity base layer region until the sidewall of the insulating layer no longer overlaps an edge of the low resistivity base layer region, and introducing ions of the first conductivity type impurity into the base layer to form a source layer while a resist mask and the insulating layer covering the gate electrode mask a portion of the base layer. As a result of the formation steps, an edge of the low resistivity base layer region can be precisely positioned near an edge of the source layer facing the channel side and thus, the parasitic transistor hardly becomes conductive because its base resistance is reduced greatly.

8 Claims, 5 Drawing Sheets

METHOD FOR MANUFACTURING MOS TYPE SEMICONDUCTOR DEVICES

This application is a continuation-in-part of application Ser. No. 07/321,163 filed Mar. 9, 1989, now abandoned.

BACKGROUND OF THE INVENTION

1. Field of the Invention

The present invention relates to a method for manufacturing MOS type semiconductor devices, such as a power MOSFET, insulating gate type bipolar transistor, etc.

2. Description of the Prior Art

In MOS type semiconductor devices, a power MOSFET utilizing only majority carriers is known. Also, an insulated gate bipolar transistor (known as IGBT, IGT or COMFET) utilizing a conduction modulation caused by the two types of carriers, that is, electrons and holes is known.

One example of this type of semiconductor device is disclosed in U.S. Pat. Nos. 4,672,407 or 4,587,723.

FIG. 1 is a cross-sectional view showing a prior art power MOSFET which is usually manufactured by the following process steps. First, a p+ type diffused region 3 is formed in a surface of an n− type high resistivity layer 1 which constitutes a semiconductor substrate with an n+ type low resistivity layer 2. After forming a gate electrode 5 on the same surface of the n− type high resistivity layer 1 via a gate insulating film 41, an opening is formed in the gate electrode 5 by the photolithography method. An impurity diffusion for forming a p type base layer 6 is conducted by using the gate electrode 5 having the opening as a mask, and a p+ type low resistivity base layer region 7 is formed in the p type base layer 6 by photolithography and diffusion process steps.

Thereafter, by using again the gate electrode 5 as a part of a mask, an n+ type source layer 8 is formed, and the surfaces are covered by an insulating film 42. After forming a contact hoe in the insulating film 42, a source electrode 11 is formed, and also a drain electrode 12 contacted to the n+ type low resistivity layer 2 is formed.

In the semiconductor device thus constructed, when a positive voltage is applied to the gate electrode 5 with respect to the source electrode 11, a channel 9 is produced in a surface of the p type base layer 6 just under the gate insulating film 41, thereby causing a conductive state by injecting electron into the drain layer, consisting of the high resistivity layer 1 and the low resistivity layer 2, from the n+ type source layer 8 through the channel 9. When the potential of the gate electrode 5, is maintained at the same potential as the source electrode 11 or a negative voltage is applied relative to the source electrode 11, a non-conductive state is caused. Therefore, the abovedescribed device operates as a switching element.

FIG. 2 shows a prior art insulated gate type bipolar transistor (IGBT). The IGBT can be manufactured by using a semiconductor substrate consisting of a p+ type drain layer 10, an n+ type buffer layer 2 and an n− type high resistivity layer 1, through the same process steps as in the power MOSFET. The difference of the IGBT from the power MOSFET is as follows. When electrons are injected into the p+ type drain layer 10 from the n+ type source layer 8 through the channel 9, the n− type high resistivity layer 1 and the n+ type buffer layer 2, because the drain layer 10 is of p+ type layer, holes are injected into the n− type high resistivity layer 1 from the p+ type drain layer 10, in response to the injection of electrons, through the n+ type buffer layer 2. Therefore, the n− type high resistivity layer 1 changes its electrical conductance so as to have a low resistance.

When the MOSFET shown in FIG. 1 is turned off under a condition of connecting an inductive load as in an inverter circuit etc. the device is sometimes destroyed. The reason for such destruction will be explained by referring to FIG. 3. When the MOSFET is turned off under the inductive load, a depletion layer 22 is promptly produced at both sides of the PN junction 21. A portion of the hole carriers emitted at this time flows in a portion of the p type base layer 6 under the n+ type source layer 8 as a hole current 23. Because the surface of the p type base layer 6 and the n+ type source layer 8 are short-circuited by the source electrode 11, a potential difference calculated by multiplying the hole current 23 by a base resistance Rb is produced between the n+ type source layer 8 and the p type base layer 6. If the potential difference is greater than the built-in voltage between the base and source, a parasitic transistor consisting of the n+ type source layer 8, the p type base layer 6 and the n− type high resistivity layer 1 turns ON by injecting electrons from the source layer 8 to the p type base layer 6, thereby destroying the device.

An object for forming the p+ type diffused layer 3 is to prevent the device destruction due to the turning ON of the parasitic transistor by reducing the hole current 23 flowing under the n+ type source layer 8.

An object for forming the p+ type low resistivity base layer region 7 is to positively prevent the device destruction due to the turning ON of the parasitic transistor, that is, it intends to decrease the base resistance Rb mentioned above for preventing the turning ON of the parasitic transistor.

However, a sufficient turn-off capability in the power MOSFET under the inductive load is not obtained even though these counter measures are taken to meet the situation.

In case of the IGBT shown in FIG. 2 the device destruction is sometimes caused by the turning ON of the parasitic transistor consisting of the n+ type source layer 8, the p type base layer 6 and the n− type high resistivity layer 1 when a turn-off operation under the inductive load occurs as in the power MOSFET. Further, a more difficult problem is that the hole current 23 flowing under the n+ type source layer 8 exist, even in a normal ON state operation. Therefore, the IGBT is sometimes destroyed by the turning ON of the parasitic transistor even in a turn-off operation without an inductive load or even in the normal ON state operation. In the case of the IGBT as well as the power MOSFET, an effort has been conducted to prevent the ON state of the parasitic transistor by providing the p+ typed diffused layer 3 and p+ type low resistivity base layer region 7. However, the result is not sufficient.

SUMMARY OF THE INVENTION

It is an object of the present invention to provide a method for manufacturing a MOS type semiconductor device having a large turn-off capability by positively preventing the operation of the parasitic transistor at a low cost.

In the first aspect of the present invention, a method for manufacturing a MOS type semiconductor device comprises the steps of:

providing a semiconductor drain layer of a first conductivity type, the semiconductor drain layer having a gate insulating film on a surface thereof;

forming a gate electrode on the surface of the semiconductor drain layer, the gate electrode being electrically insulated from the drain layer by the gate insulating film;

introducing a second conductivity type impurity into the drain layer to form a base layer of the second conductivity type, the gate electrode masking a portion of the drain layer;

forming an insulating layer on the surface of the semiconductor drain layer and on the gate electrode, the insulating layer being of a thickness and having a sidewall of a width parallel to the surface of the drain layer, the thickness being substantially perpendicular to the width;

introducing ions of the second conductivity type impurity into the base layer to form a low resistivity base layer region in the base layer;

isotropically etching the insulating layer to reduce the thickness of the insulating layer and the width of the sidewall which overlaps the resultant low resistivity base layer region until the sidewall of the insulating layer no longer overlaps an edge of the low resisitivity base layer region;

forming a resist mask on a portion of the insulating layer; and introducing ions of the first conductivity type impurity into the base layer to form a source layer, the resist mask and said insulating layer covering the gate electrode masking a portion of the base layer.

Here, the ions of the second conductivity type impurity may be introduced into the base layer by ion implantation.

The resist mask may be formed by photolithography.

The ions of the first conductivity type impurity may be introduced into the base layer by ion implantation.

In the second aspect of the present invention, a method for manufacturing a MOS type semiconductor device comprises the steps of:

providing a semiconductor drain layer of a first conductivity type, the semiconductor drain layer having a gate insulating film on a surface thereof;

forming a gate electrode of a predetermined thickness on the surface of the semiconductor drain layer, the gate electrode being electrically insulated from the drain layer by the gate insulating film;

introducing a second conductivity type impurity into the drain layer to form a base layer of the second conductivity type, said gate electrode masking a portion of the drain layer;

introducing the second conductivity type impurity into the base layer thereby forming a low resistivity base layer region;

isotropically etching the gate electrode to reduce its thickness and to reduce a region of the gate electrode which overlaps an edge of the resultant low resistivity base layer region until the gate electrode no longer overlaps the edge of the low resistivity base layer region;

forming a resist mask on a portion of the gate insulation film; and introducing the first conductivity type impurity into the base layer while using the resist mask and the gate electrode to mask a portion of the base layer to form a source layer.

Here, the second conductivity type impurity may be introduced into the base layer by ion implantation.

The resist mask may be formed by photolithography.

The first conductivity type impurity may be introduced by ion implantation.

According to the present invention, both the low resistivity base layer region of the second conductivity type having high impurity concentration and the source layer of the first conductivity type having high impurity concentration are formed by self-alignment using the gate electrode as a mask, and therefore, an edge of the low resistivity base layer region can be precisely positioned near an edge of the source layer facing the channel side. Consequently, the parasitic transistor hardly enters the ON state, because of a great reduction of its base resistance.

The above and other objects, effects, features and advantages of the present invention will become more apparent from the following description of embodiments thereof, taken in conjunction with the accompanying drawings.

DETAILED DESCRIPTION OF PREFERRED EMBODIMENTS

Figure 1:
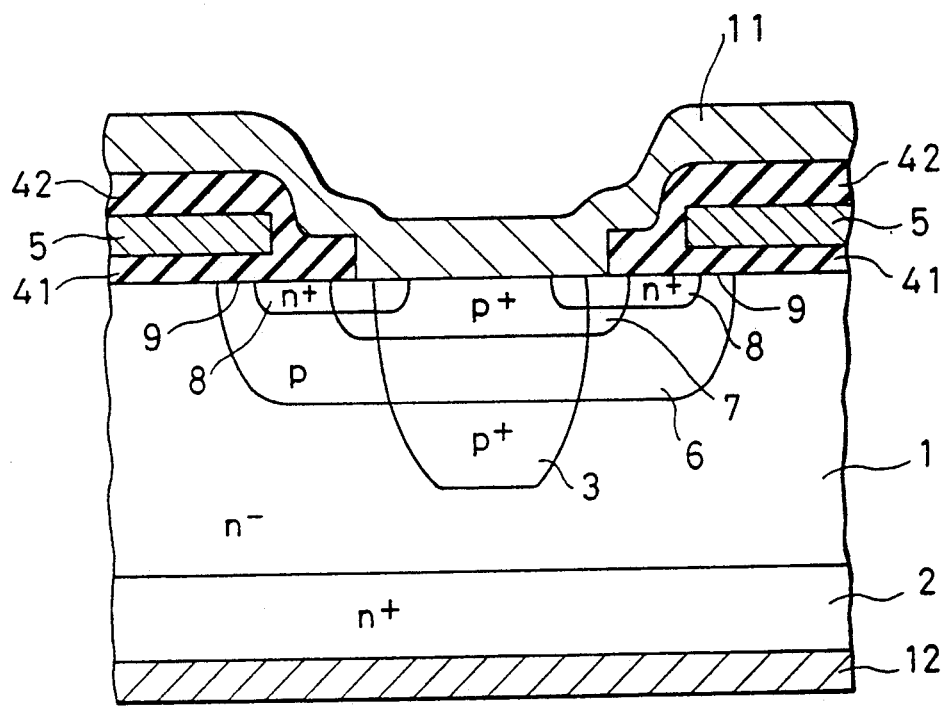
FIG. 1 is a cross-sectional view showing an example of a conventional power MOSFET.
Figure 2:
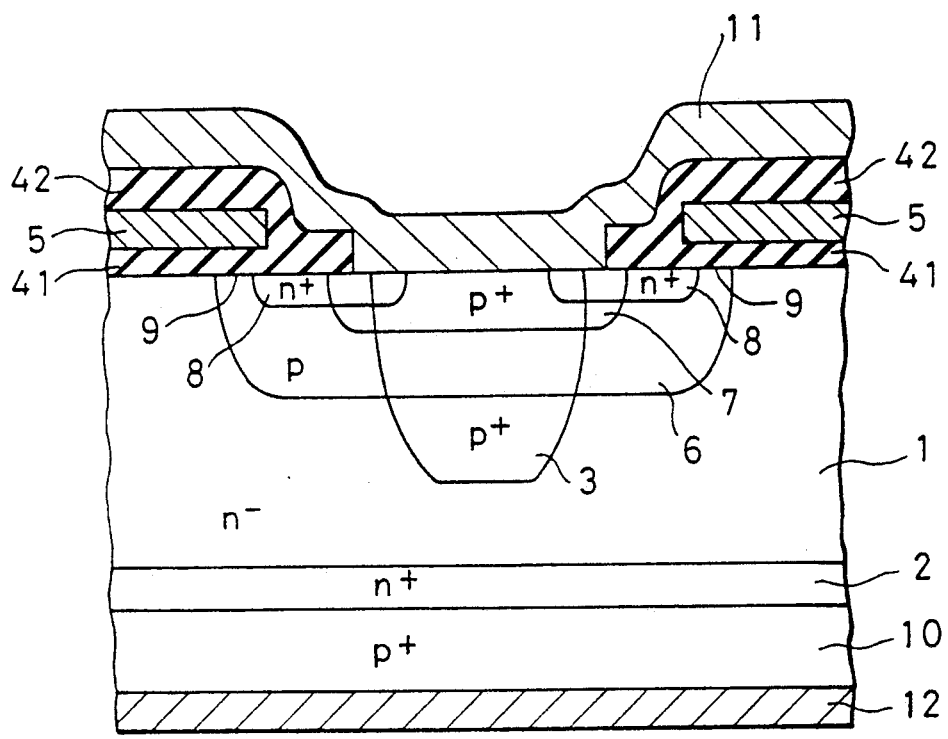
FIG. 2 is a cross-sectional view showing an example of a conventional IGBT.

FIGS. 4A-4D show process steps in one embodiment of the present invention, and the same components as those in FIG. 1 and FIG. 2 are indicated by the same reference numerals. First, an oxide layer 40 is grown when the p type base layer 6 is formed by diffusion. The p type base layer 6 and the oxide layer 40 can be formed either in parallel or in series after the gate electrode 5 has been formed.

When these layers 6 and 40 are formed in parallel, the oxide layer 40 is formed during an annealing period of the base layer 6. More specifically, p type base layer 6 is formed by implanting boron ions and then diffusing the boron ions by annealing with a high temperature. The oxide layer 40 is formed during the annealing process by flowing oxygen and steam on the substrate. The annealing is carried out by using a common furnace. Annealing parameters are temperature and time: the temperature is approximately 1,100° C., and the annealing time is about 4 hours.

On the other hand, when those layers 6 and 40 are formed in series, the oxide layer 40 is formed by using CVD method after the p type base layer 6 has been formed. The thickness of the oxide layer 40 is preferably 3,000 Å to 5,000 Å. Thickness up to 10,000 Å is possible.

Figure 4A:
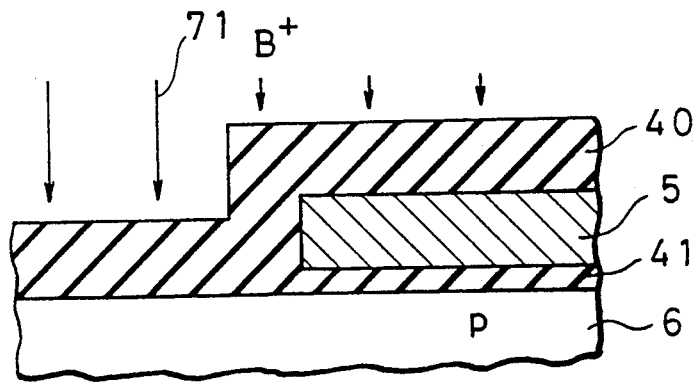
FIGS. 4A-4D are cross-sectional views showing a part of process steps according to one embodiment of the present invention.

Next, ion implantation of, for example, boron ions 71 is conducted with a proper energy (FIG. 4A). This energy varies with the thickness of the oxide 40: for example, approximately 120 keV when the oxide 40 is 3,000 Å thick; approximately 160 keV when the oxide 40 is 4,000 Å, and approximately 210 keV when the oxide 40 is 5,000 Å.

Figure 4B:
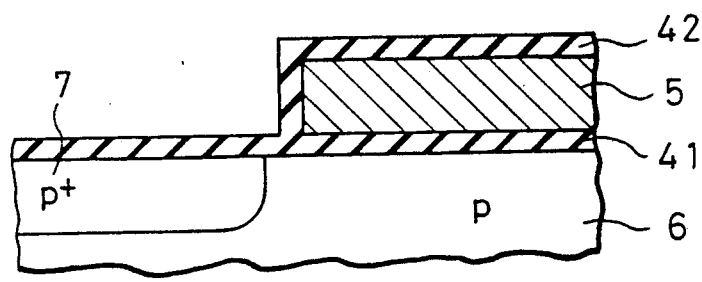

After that, the p+ type low resistivity base layer region 7 is formed by annealing heat treatment. The annealing is carried out by using a common furnace. Annealing parameters are temperature and time: the temperature is approximately 1,000° C., and the annealing time is about 30–90 minutes. Then the oxide layer 40 is thinned by isotropic etching to form insulating film 42 (FIG. 4B). The etching is performed by means of buffered hydrofluoric acid so that the oxide 40 approximately 300–700 Å thick remains. For example, when the initial thickness of the oxide 40 is 5,000 Å, the thickness of 4300–4,700 Å is etched.

Figure 4C:
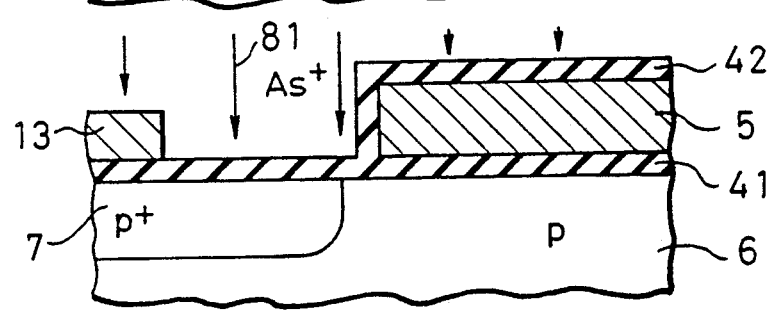
Figure 4D:
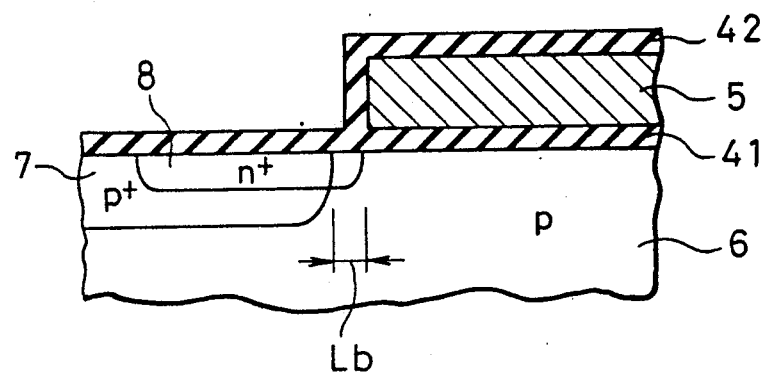

Thereafter, a resist mask 13 is formed by photolithography, and ion implantation of, for example, arsenic ions 81 is conducted with a proper energy (FIG. 4C). The proper energy for arsenic ions 81 is 100–150 keV when the thickness of the oxide 42 remaining after etching is 300–700 Å. After removing the resist mask 13, the n+ type source layer 8 is formed by annealing heat treatment (FIG. 4D). The annealing is carried out by using the common diffusion furnace, with the temperature of approximately 1,000° C. and the annealing time of about 5–15 minutes.

Figure 3:
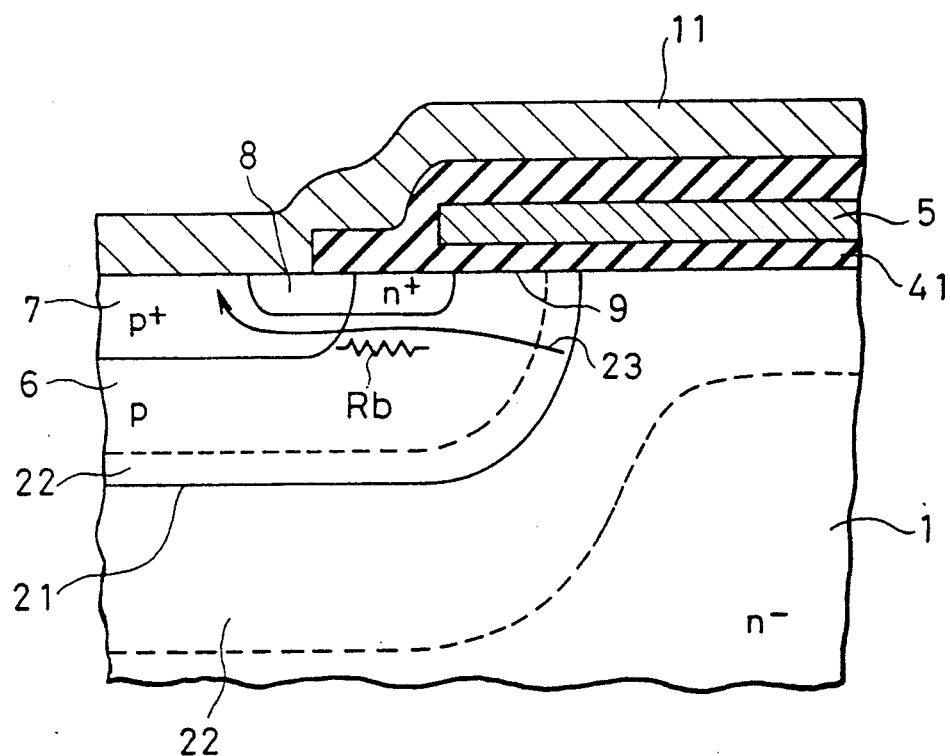
FIG. 3 is a cross-sectional view showing a problem involved in the conventional IGBT.

Through the above-described process steps, a distance Lb between an edge of the p+ type low resistivity base layer region 7 and an edge of the n+ type source layer 8 facing the channel side can become small, such a value as one tenth or less compared to conventional manufacturing process steps, thereby reducing greatly the base resistance Rb (refer to FIG. 3), thereby positively preventing the parasitic transition from turning ON. Further, the photo-lithography process step for forming the p+ type low resistivity layer 3 shown in FIG. 1 and 2 can be omitted. Therefore, a semiconductor device with high performance can be provided at a low cost.

Figure 5A:
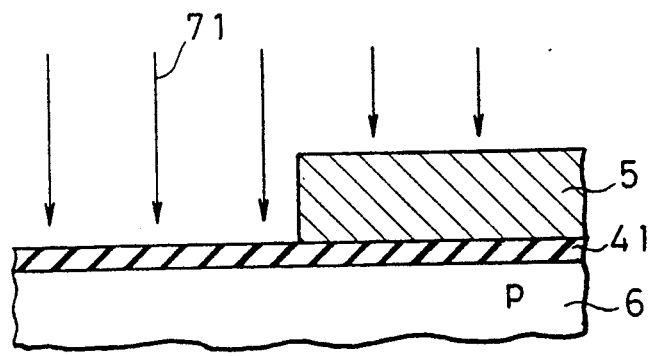
FIGS. 5A-5D are cross-sectional views showing a part of process steps according to another embodiment of the invention.
Figure 5B:
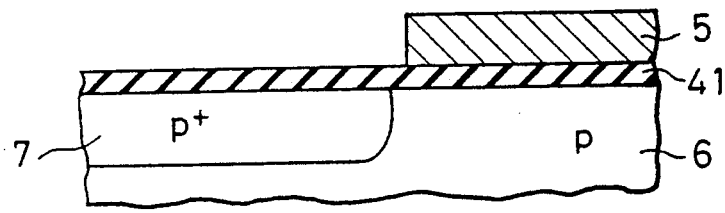

FIGS. 5A–5D show another embodiment. This embodiment is also an n channel MOS type semiconductor device. In this case, at first, a gate electrode 5 thicker than a final thickness shown in FIG. 5B is formed. The initial thickness of the gate electrode 5 is approximately 8,000–15,000 Å. After forming an opening in the gate electrode 5 by photo-lithography and diffusing for the p type base layer 6, ion implantation of, for example, boron ions 71 is conducted with a proper energy. The proper energy for boron ion is approximately 40–100 keV (FIG. 5A).

Next, the p+ type low resistivity base layer region 7 is formed in the p type base layer 6 through an annealing heat treatment. The annealing is carried out by using a common furnace. Annealing parameters are temperature and time: the temperature is approximately 1,000° C., and the annealing time is about 30–90 minutes. The gate electrode 5 is isotropically etched to thin the thickness, and the gate electrode 5 is also etched to reduce an overlapping region to the p+ type low resistivity base layer region 7 (FIG. 5B). By this etching, the initial thickness of the thicker gate electrode of about 8,000–15,000 Å is thinned by approximately 3,000–7,000 Å (i.e., the length Lb) by using mixed solution of hydrofluoric acid, nitric acid and acetic acid so that the final thickness of the gate electrode 5 becomes approximately 5,000–8,000 Å.

Figure 5C:
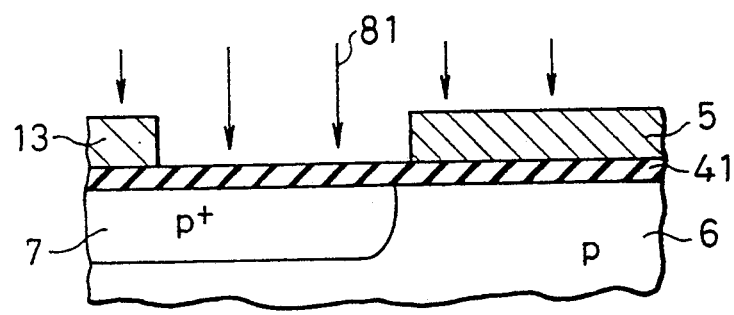

Next, a resist mask 13 is formed by photolithography, and ion implantation of for example, arsenic ions 81 is conducted with a proper energy (FIG. 5C). The proper energy for arsenic ions 81 is 100–150 keV when the thickness of the oxide 41 is 300–700 Å.

Figure 5D:
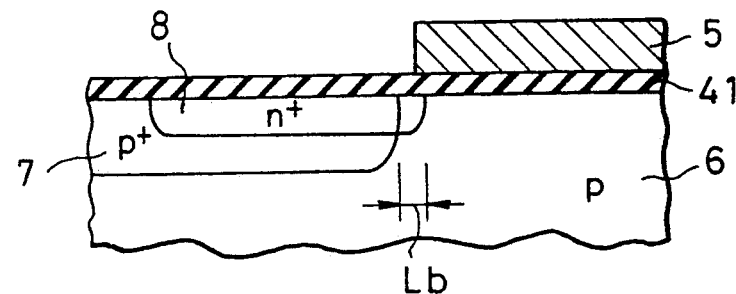

Next, after removing the resist mask 13, the n+ type source layer 8 is formed through annealing heat treatment (FIG. 5D). The annealing is carried out by using the common diffusion furnace, with the temperature of approximately 1,000° C. and the annealing time of about 5–15 minutes.

Through these process steps, as the previous embodiment, a distance Lb between an edge of the p+ type low resistivity base layer region 7 and an edge of the n+ type source layer 8 facing the channel side can become small (Lb=3,000–7,000 Å), such value as one tenth or less compared to conventional manufacturing process steps, thereby reducing greatly the base resistance Rb (refer to FIG. 3) and hardly rendering turning ON of the parasitic transistor. Further, the photo-lithography process step for forming the p+ type low resistivity layer 7 in the prior art can be omitted. Therefore, a semiconductor device with high performance can be provided at a low cost.

Although the above-described embodiments concern only n channel type divides, the present invention can be applicable also to a p channel type device, and also to MOS type semiconductor devices other than power MOSFET or IGBT.

According to the present invention, both of the low resistivity base layer region of the second conductivity type having a high impurity concentration and the source layer of the first conductivity type having a high impurity concentration are formed by self-alignment using the gate electrode as a mask, and therefore, an edge of the low resistivity base layer region can be precisely positioned near an edge of the source layer facing the channel side. Consequently, the base resistance of the parasitic transistor consisting of the source layer, the base layer and the drain layer is greatly reduced. Thus, the parasitic transistor hardly turns on, thereby eliminating device destruction and enhancing the current turn-off capability in the MOS type semiconductor device. Moreover, one photolithography process step can be omitted by adopting the self-alignment method, and therefore, a device having high performance can be manufactured at a low cost.

The invention has been described in detail with respect to preferred embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

What is claimed is:

1. A method for manufacturing a MOS type semiconductor device comprising the steps of:
   providing a semiconductor drain layer of a first conductivity type, the semiconductor drain layer having a gate insulating film on a surface thereof;
   forming a gate electrode on the surface of the semiconductor drain layer, the gate electrode being electrically insulated from the drain layer by the gate insulating film;
   introducing a second conductivity type impurity into said drain layer to form a base layer of the second conductivity type, said gate electrode masking a portion of said drain layer;

forming an insulating layer on the surface of said semiconductor drain layer and on said gate electrode, said insulating layer being of a thickness and having a sidewall of a width parallel to the surface of said drain layer, said thickness being substantially perpendicular to the width;

introducing ions of the second conductivity type impurity into said base layer to form a low resisitivity base layer region in said base layer;

isotropically etching said insulating layer to reduce the thickness of the insulating layer and the width of the sidewall which overlaps the resultant low resistivity base layer region until the sidewall of said insulating layer no longer overlaps an edge of said low resistivity base layer region;

forming a resist mask on a portion of said insulating layer; and introducing ions of the first conductivity type impurity into said base layer to form a source layer, said resist mask and said insulating layer covering said gate electrode masking a portion of said base layer.

2. A method as claimed in claim 1, wherein the ions of the second conductivity type impurity are introduced into said base layer by ion implantation.

3. A method as claimed in claim 1, wherein said resist mask is formed by photo-lithography.

4. A method as claimed in claim 1, wherein the ions of the first conductivity type impurity are introduced into said base layer by ion implantation.

5. A method for manufacturing a MOS type semiconductor device comprising the steps of:

providing a semiconductor drain layer of a first conductivity type, the semiconductor drain layer having a gate insulating film on a surface thereof;

forming a gate electrode of a predetermined thickness on the surface of said semiconductor drain layer, the gate electrode being electrically insulated from the drain layer by the gate insulating film;

introducing a second conductivity type impurity into said drain layer to form a base layer of the second conductivity type, said gate electrode masking a portion of said drain layer;

introducing the second conductivity type impurity into said base layer thereby forming a low resistivity base layer region;

isotropically etching said gate electrode to reduce its thickness and to reduce a region of the gate electrode which overlaps an edge of said resultant low resistivity base layer region until said gate electrode no longer overlaps the edge of said low resistivity base layer region;

forming a resist mask on a portion of said gate insulation film; and introducing the first conductivity type impurity into said base layer while using said resist mask and said gate electrode to mask a portion of said base layer to form a source layer.

6. A method as claimed in claim 5, wherein the second conductivity type impurity is introduced into said base layer by ion implantation.

7. A method as claimed in claim 5, wherein the resist mask is formed by photo-lithography.

8. A method as claimed in claim 5, wherein the first conductivity type impurity is introduced by ion implantation.

* * * * *

UNITED STATES PATENT AND TRADEMARK OFFICE
CERTIFICATE OF CORRECTION

PATENT NO. : 5,118,638
DATED : June 2, 1992
INVENTOR(S) : Tatsuhiko FUJIHIRA

It is certified that error appears in the above-indentified patent and that said Letters Patent is hereby corrected as shown below:

On the Title Page:

-- [30]   Foreign Application Priority Data
    March 18th, 1988   [JP]   Japan ........ 65,423/1988   --

Signed and Sealed this

Eighth Day of November, 1994

Attest:

BRUCE LEHMAN

*Attesting Officer*       *Commissioner of Patents and Trademarks*